US007193478B2

(12) United States Patent
Filip

(10) Patent No.: US 7,193,478 B2
(45) Date of Patent: Mar. 20, 2007

(54) SIGNAL TRANSMISSION IN OPTO-ELECTRONIC DEVICES BY MOVING THE QUIESCENT COMPONENT OF A DIFFERENTIAL SIGNAL

(75) Inventor: Jan Filip, Burgwedel (DE)

(73) Assignee: Maxim Integrated Products, Inc., Sunnyvale, CA (US)

( * ) Notice: Subject to any disclaimer, the term of this patent is extended or adjusted under 35 U.S.C. 154(b) by 236 days.

(21) Appl. No.: 10/406,532

(22) Filed: Apr. 3, 2003

(65) Prior Publication Data

US 2004/0196105 A1 Oct. 7, 2004

(51) Int. Cl.
*H03F 3/08* (2006.01)
(52) U.S. Cl. .................... 330/308; 250/214 A
(58) Field of Classification Search ............... 330/308, 330/85, 86, 59; 250/214 A, 214 AG
See application file for complete search history.

(56) References Cited

U.S. PATENT DOCUMENTS 6,114,913 A * 9/2000 Entrikin ..................... 330/308
6,342,694 B1 * 1/2002 Satoh ..................... 250/214 A
6,844,784 B1 * 1/2005 Denoyer et al. ............ 330/308

* cited by examiner

*Primary Examiner*—Khanh Van Nguyen
(74) *Attorney, Agent, or Firm*—Blakely Sokoloff Taylor & Zafman LLP

(57) ABSTRACT

Signal transmission in opto-electronic devices by moving the quiescent component of a differential signal. Exemplary circuits and techniques are disclosed for moving the quiescent component of the differential output signal of a preamplifier amplifying the output of a photodiode to provide an indication of the received signal strength. The quiescent component is moved in response to the average diode current, either symmetrically by imposing the same change on the differential outputs of the preamplifer, or unsymmetrically such as by imposing a change on one of the differential outputs only, and either linearly or nonlinearly with the average diode current. Detection in a postamplifier may be by open circuit techniques, such as by comparing the quiescent output of the preamplifier with a fixed reference, or by using feedback techniques that can cancel or alter the imposed quiescent component. Also exemplary embodiments for use in conjunction with opto-electronic transmitters are disclosed.

23 Claims, 8 Drawing Sheets

US 7,193,478 B2

SIGNAL TRANSMISSION IN OPTO-ELECTRONIC DEVICES BY MOVING THE QUIESCENT COMPONENT OF A DIFFERENTIAL SIGNAL

BACKGROUND OF THE INVENTION

1. Field of the Invention

The present invention relates to the field of opto-electronic devices.

2. Prior Art

The present invention is intended for use in opto-electronic devices, such as, by way of example, transmitters and receivers used in fiber-optic systems. On the transmitter side of a fiber optic system, a laser diode with laser diode driver circuitry and a monitor diode are generally packaged in a 3 pin TO-HEADER package, with a laser diode driver circuitry, typically a laser driver integrated circuit.

On the receiver side, transimpedance amplifiers are used to amplify the output of photodiodes receiving the optical signal. In such applications, the receiver in the fiber optic communications system typically comprises a photodiode and a preamplifier in a four pin header package, the preamplifier typically being a transimpedance amplifier to provide a voltage output responsive to the photodiode current output. The typical four pin package devotes two pins to power input and two pins to a differential output. However, new standards are requesting diagnostic functions from the optical preamplifier, such as a received signal strength indication (RSSI). A received signal strength indication signal is not difficult to generate within the preamplifier, though using conventional techniques, would require additional pins, or at least one additional pin, to bring out the RSSI signal.

BRIEF SUMMARY OF THE INVENTION

Signal transmission in opto-electronic devices by moving the quiescent component of a differential signal. Exemplary circuits and techniques are disclosed for moving the quiescent component of the differential output signal of a preamplifier amplifying the output of a photodiode to provide an indication of the received signal strength. The quiescent component is moved in response to the average diode current, either symmetrically by imposing the same change on the differential outputs of the preamplifer, or unsymmetrically such as by imposing a change on one of the differential outputs only, and either linearly or nonlinearly with the average diode current. Detection in a postamplifier may be by open circuit techniques, such as by comparing the quiescent output of the preamplifier with a fixed reference, or by using feedback techniques that can cancel or alter the imposed quiescent component. Also exemplary embodiments for use in conjunction with opto-electronic transmitters are disclosed.

DETAILED DESCRIPTION OF PREFERRED EMBODIMENTS

Figure 1:
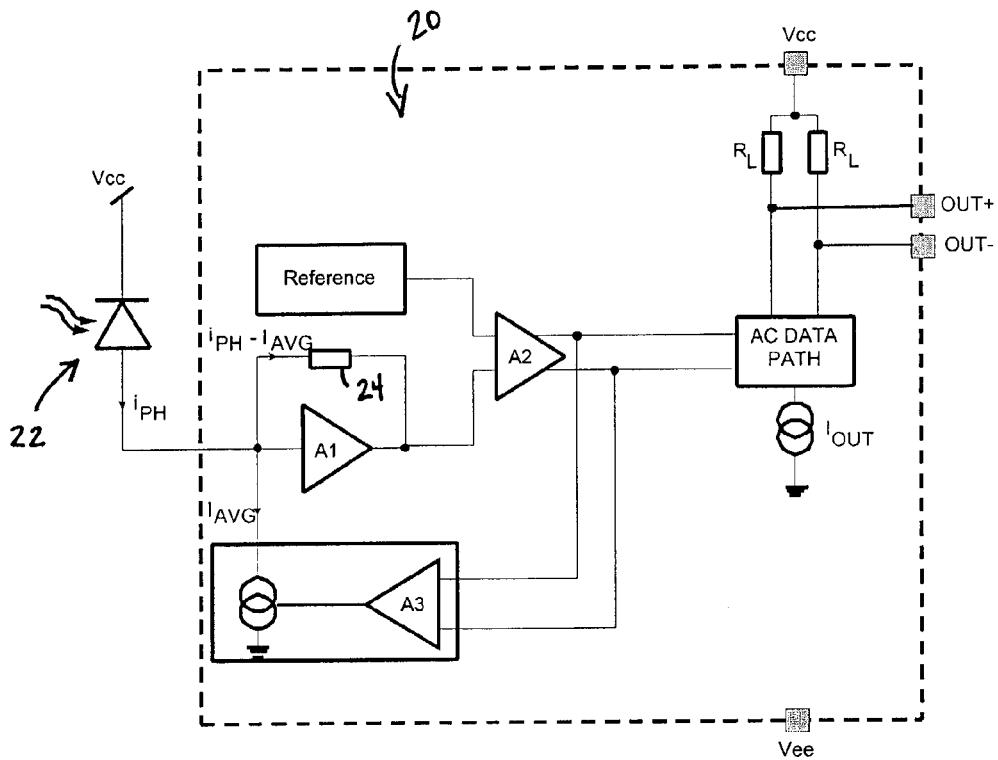
FIG. 1 is a block diagram of a photodiode and preamplifier in accordance with the prior art. This diagram is representative of the preamplifier circuits with which the present invention may be used, and is to be considered incorporated as an exemplary implementation of a preamplifier circuit in various diagrams of exemplary embodiments of the invention presented herein, even though not repeated in its entirety in such diagrams.

First referring to FIG. 1, a block diagram of a typical prior art preamplifier, generally indicated by the numeral 20, having its input coupled to a photodiode, generally indicated by the numeral 22, may be seen. In a typical implementation, the preamplifier 20 is formed as an integrated circuit, and packaged by a module manufacturer with the photodiode in a four pin header package as hereinbefore mentioned, as is well known in the art. Accordingly, while the integrated circuit itself is a five terminal device, the photodiode 22 is coupled between one of those terminals and the positive power supply terminal Vcc, so that the packaged preamplifier integrated circuit and photodiode together form a four terminal module.

The preamplifier itself in the implementation of FIG. 1 is comprised of an amplifier stage A1 and feedback resistor 24, providing one input to differential amplifier A2. The other input to the amplifier A2 is provided by the Reference circuit. The output of the differential amplifier A2 controls the AC data path, and thus the AC output on the output terminals OUT+, OUT−, having an output impedance determined by the load resistors $R_L$. The output of the differential amplifier A2 is also provided to amplifier A3 configured as an integrating amplifier, the output of which controls a current source coupled to the input of amplifier A1.

The foregoing components are typical of prior art transimpedance amplifiers, and operate as follows. The light input to photodiode 22, typically from an optical fiber cable, will normally be modulated with digital data. Thus the light impinging on the photodiode, and therefore the current $i_{PH}$ through the photodiode, will switch between a relatively high value, and either a relatively low value or essentially zero or an off condition, in accordance with the digital data being optically transmitted on the fiber optic cable. The output of amplifier A1 will be in the form of a single-ended electrical data stream replicating the optical data stream in the fiber optic cable. This electrical data stream will have some average value, though normally will be at a voltage higher or lower than the average value at any particular instant, depending upon the logical state of the data then being transmitted. Since the input to amplifier A2 from the Reference block is simply a DC value, the electrical data stream output of amplifier A1, as applied to one of the differential inputs of A2, will provide a differential output of amplifier A2 duplicating the optical data stream on the fiber optic cable. Consequently, the outputs OUT+ and OUT− are differential outputs referenced to the positive power supply.

Amplifiers A1 and A2 may be considered to be an input stage amplifying the photodiode current to provide a differential AC output proportional to the photodiode current to control the AC data path and thus the outputs OUT+, OUT−. In that regard, a reference to an amplifier stage as used herein and in the claims is used in the general sense to refer to a part of a preamplifier or postamplifier, and may include multiple "amplifiers" (such as A1 and A2 in FIG. 1) and include stages having an overall gain arising from the gain of multiple devices or amplifiers within the stage (the input stage of FIG. 1 has a gain equal to the gain of amplifier A1 (as set by its feedback) times the gain of amplifier A2).

In the prior description, it was assumed that the output of amplifier A1 would swing above and below the output of the Reference so that the input to amplifier A2 is a positive and negative differential input, depending on the state of the data being transmitted at the time. This is assured by keeping the average differential output of amplifier A2 at substantially zero volts. In particular, feedback amplifier A3 will integrate the average output of amplifier A2 to adjust the current output of the current source to track the average photodiode output current $I_{AVG}$. This assures that the photodiode current $i_{PH}$ will swing above and below that average, assuring a balanced differential input to amplifier A2. The feedback amplifier A2 provides a single pole at very low frequencies, which is dependent on the data rate, line coding, and the forward gain of the amplifier.

The foregoing generally describes the operation of certain prior art transimpedance amplifiers used to amplify the output of a photodiode. In such circuits, the common mode output will be $(I_{OUT}*R_L)/2$ below the positive power supply voltage, and is independent of the received signal strength. Consequently, the differential AC output OUT+, OUT− merely replicates the AC data stream. Usually the AC data path is a current steering path, and the current $I_{OUT}$ may all flow through one of the load resistors at any one time, in which case the differential output OUT+, OUT− contains no information with respect to the received signal strength.

The foregoing prior art preamplifier is representative of the preamplifiers to which the present invention may be applied. Accordingly, in some of the embodiments to follow, only a part of the preamplifier circuit is replicated so as to better focus on the present invention, it being understood that the rest of the preamplifier of FIG. 1 or some similar preamplifier circuit would also be a part of the full circuit.

Figure 2:
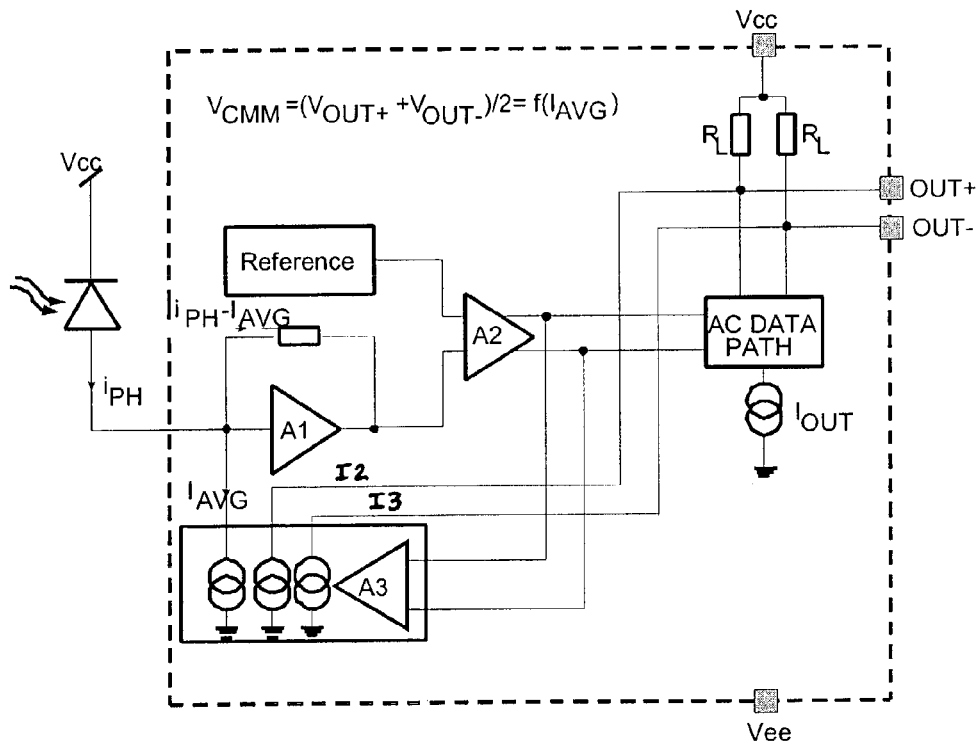
FIG. 2 is a block diagram of a photodiode and preamplifier in accordance with one embodiment of the present invention.

In one embodiment of the present invention as shown in FIG. 2, two current outputs I2 and I3 are added, replicating the current in current output $I_{AVG}$ (though not necessarily in a one to one ratio) to provide a current drain on both of the differential outputs OUT+, OUT−. This imposes an equal voltage drop in the load resistors $R_L$ in proportion to the average diode current $I_{AVG}$. As stated before, the light impinging on the photodiode, and thus the current $i_{PH}$ through the photodiode, will switch between relatively high values, and either a relatively low value or essentially zero or an off condition, in accordance with the digital data being optically transmitted on the fiber-optic cable. Thus the relatively high value and not the relatively low or zero value of current through the photodiode will primarily contribute to the average photodiode current. As a consequence of this, the average photodiode current will be approximately one half or slightly more than one half of the peak photodiode current, and a good measure of the peak to peak photodiode current (the received signal strength). Consequently, in this embodiment, the average voltage on each of the output pins OUT+ and OUT− relative to the positive power supply voltage (more accurately, relative to $(I_{OUT}*R_L)/2$ below the positive power supply voltage) provides the desired RSSI signal by providing a signal (or a pair of complementary signals) clearly indicative of the average current through the photodiode. As a pair of complementary signals, the average voltage on the output pins OUT+ and OUT− is the common mode voltage of the differential output OUT+, OUT−.

Figure 3:
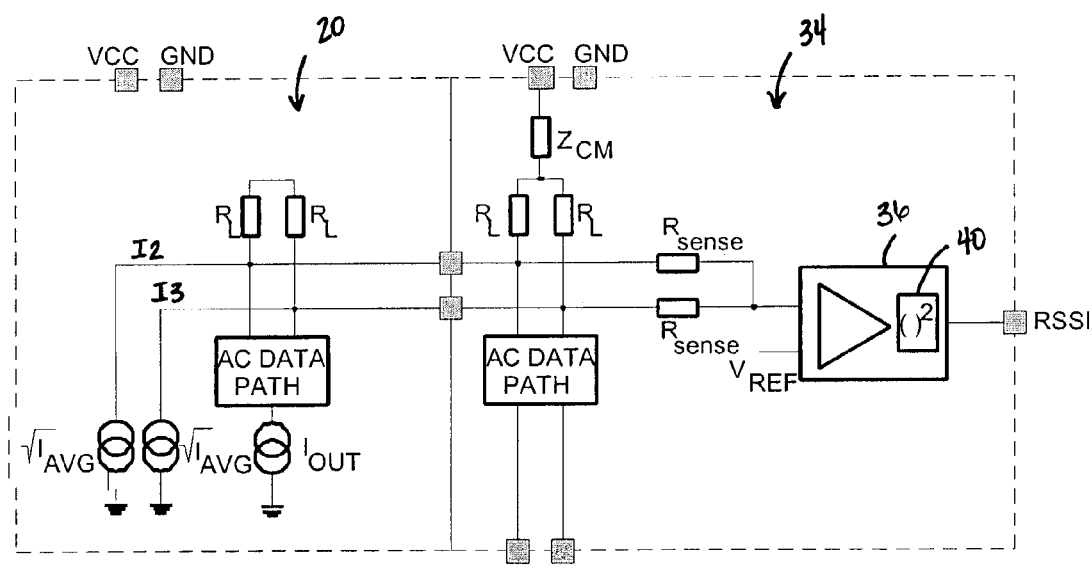
FIG. 3 shows relevant portions of the preamplifier of FIG. 2, schematically illustrated, together with associated relevant portions of an exemplary embodiment of postamplifier.

Now referring to FIG. 3, relevant portions of the preamplifier 20 of FIG. 2, schematically illustrated, together with associated relevant portions of a postamplifier, generally indicated by the numeral 34, may be seen. As previously described with respect to FIG. 2, the differential output in the embodiment of FIG. 2 is a high frequency signal duplicating the optical data stream with an average or common mode voltage superimposed thereon indicative of the received signal strength. The postamplifier includes a high frequency or AC data path providing a differential output, including load resistors $R_L$ and impedance $Z_{CM}$ (the impedance $Z_{CM}$ contributes to the common mode output impedance, but not to the input impedance of the AC output signal). The AC data path may be of conventional design, and suitable circuits for the AC data path will be well known to those skilled in the art and need not be set forth in detail herein. The postamplifier also includes sense resistors $R_{SENSE}$ that combine the average voltages of the differential signal to provide a common mode input to common mode demodulation block 36. Common mode demodulation block 36 compares the common mode voltage on the differential output of the preamplifier integrated circuit 20 with a reference voltage $V_{REF}$ to provide an output signal RSSI linearly responsive to the average current $I_{AVG}$.

In the embodiment of FIG. 3, the voltage $V_{REF}$ must be reasonably precise, as errors in this voltage directly translate to a corresponding error in the received signal strength indication (RSSI) output. Also, because the common mode parameter indicative of the received signal strength is a voltage on top of the differential output, the dynamic range of the differential output of the preamplifier/received signal strength indication is limited by the supply voltage. In this embodiment, the operating condition of the DC-coupled interface between the preamplifier 20 and the postamplifier 34 varies with the optical input power.

In the embodiment of FIG. 3, controllable current sources I2 and I3 may respond to the average current $I_{AVG}$ itself, to provide a common mode current through the load resistors $R_L$ having a function of the average current $I_{AVG}$ other than a linear function, to provide a nonlinear effect on the differential output OUT+, OUT−. The current sources might provide a current proportional to the square root of $I_{AVG}$, a log function, etc., and can be useful to compress the swing of the RSSI signal while preserving its accuracy as a percentage of reading. A postamplifier, such as postamplifier 34 of FIG. 3, would provide a received signal strength indication of the same form, or as an alternative, the postamplifier may provide an inverse function to provide the received signal strength indication output which is proportional to the average current $I_{AVG}$. Thus by way of example, if the current sources provide a current proportional to the square root of the average current $I_{AVG}$, the output of amplifier 36 may be squared in block 40 of FIG. 3 to provide a linear received signal strength indication.

Figure 4:
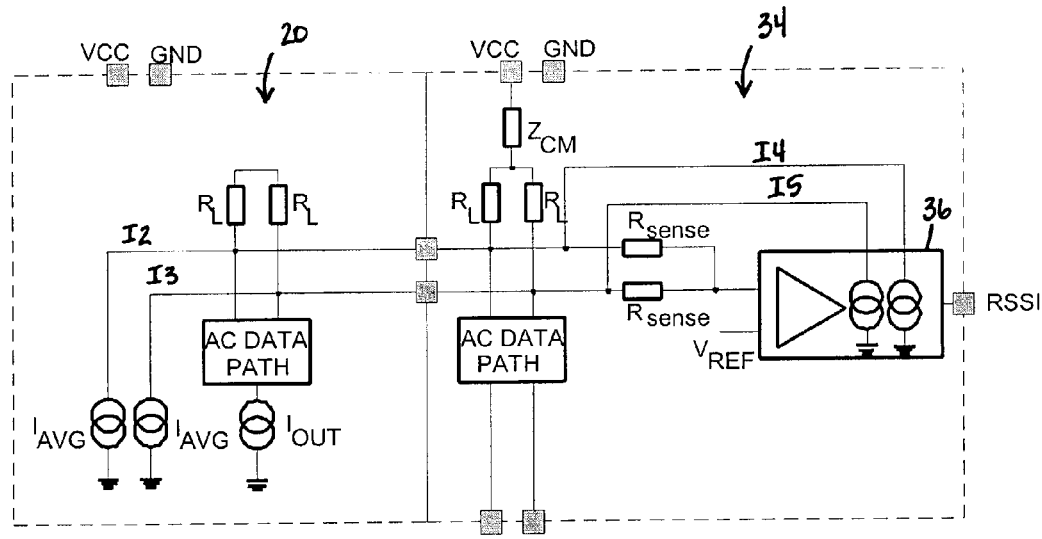
FIG. 4 shows relevant portions of one form of preamplifier of FIG. 2, schematically illustrated, together with associated relevant portions of an exemplary embodiment of postamplifier for the embodiment.

Now referring to FIG. 4, a further alternate embodiment for the postamplifier 34 may be seen. In this embodiment, the preamplifier 20 may be the same as that shown and/or described with respect to FIG. 2 or 3. In the postamplifier 34 of FIG. 4, however, the output voltages of the preamplifier 20 are averaged by the sense resistors $R_{SENSE}$ and compared with a reference voltage $V_{REF}$ by amplifier 36. The common mode demodulation block 36 provides current outputs I4 and I5, current outputs I4 and I5 generally being matched or equal current sources, equal to or ratioed to current sources I2 an I3. The RSSI signal is responsive to the feedback currents I4 an I5. As the average current $I_{AVG}$ (I2 and I3 responsive to the average current) goes up, the feedback currents I4 and I5 will go up to provide that current, so that the common mode output voltage of the predriver 20 does not change, but will remain equal to $V_{ref}$.

The embodiment of FIG. 4 also requires a precise reference voltage $V_{REF}$, and has a dynamic range limited by the supply voltage, though the DC-coupled interface between the preamplifier 20 and the postamplifier 34 doesn't vary with the optical input power.

Figure 5:
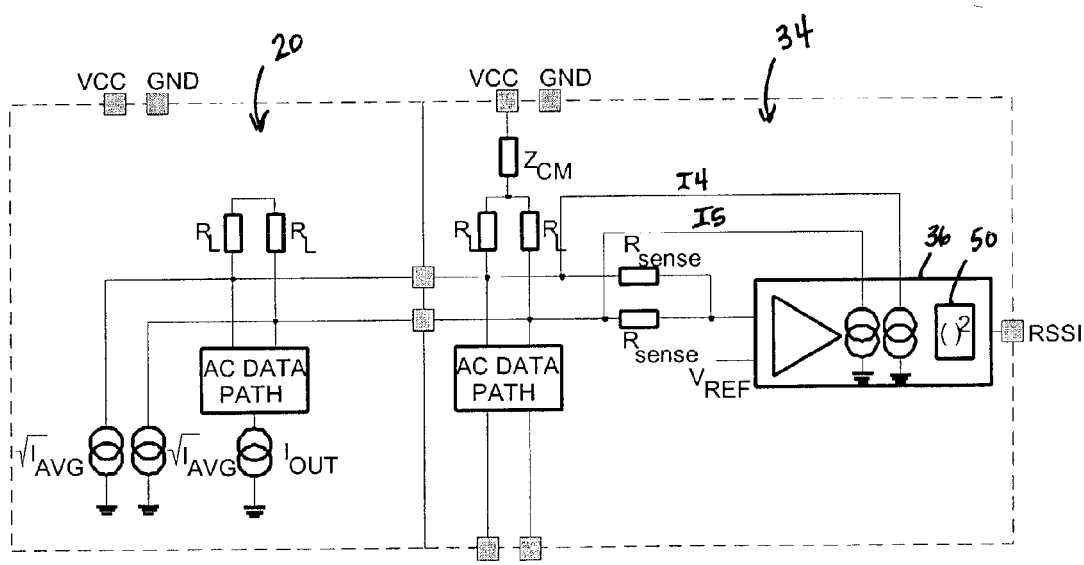
FIG. 5 shows relevant portions of the preamplifier of FIG. 3, schematically illustrated, together with associated relevant portions of another exemplary embodiment of postamplifier.

FIG. 5 is similar to FIG. 4 in some respects, though illustrates an exemplary postamplifier 34 for interfacing with a preamplifier such as that illustrated with respect to FIG. 3. Using a function such as the square root of $I_{AVG}$, as opposed to $I_{AVG}$ itself, provides a compression function whereby the output of common mode demodulation block 36 may be used to provide the compressed RSSI signal, or alternatively, the output of amplifier 36 may be squared in block 50 after removal of the offset to provide an output linearly proportional to the average current $I_{AVG}$. Here, too, a precise reference voltage is necessary and the dynamic range is reduced by the compressing technique used (square root, as shown, or alternatively a log function or some other function), though the operating conditions of the DC-coupled interface between the preamplifier 20 and postamplifier 34 do not vary with the optical power input.

Figure 6:
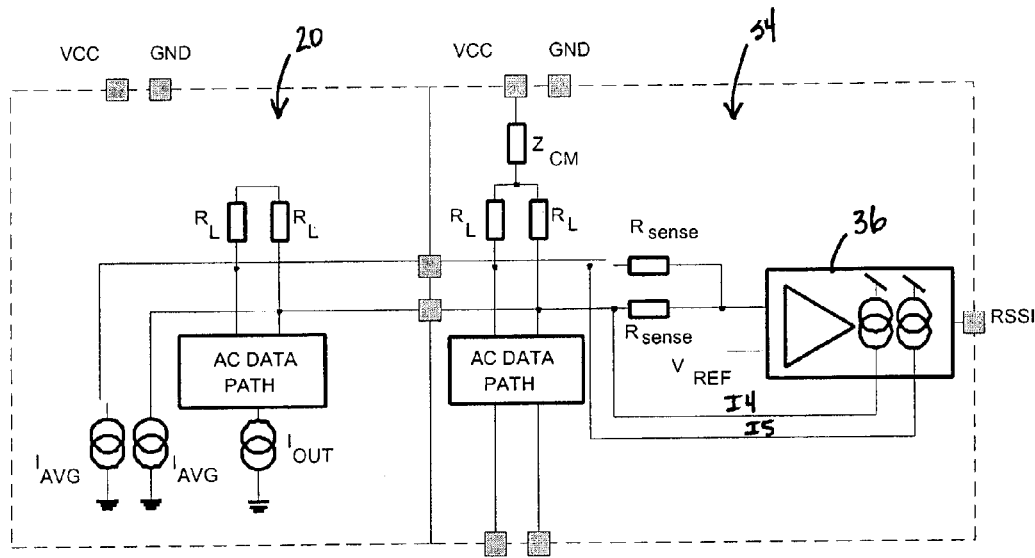
FIG. 6 shows relevant portions of a preamplifier of FIG. 2, schematically illustrated, together with associated relevant portions of still another exemplary embodiment of postamplifier.

FIG. 6 presents an embodiment similar to the embodiment of FIG. 4, though using controllable current sources for feedback currents I4 and I5 that are referenced to the high side supply rather than the low side supply as in FIG. 5

Figure 7:
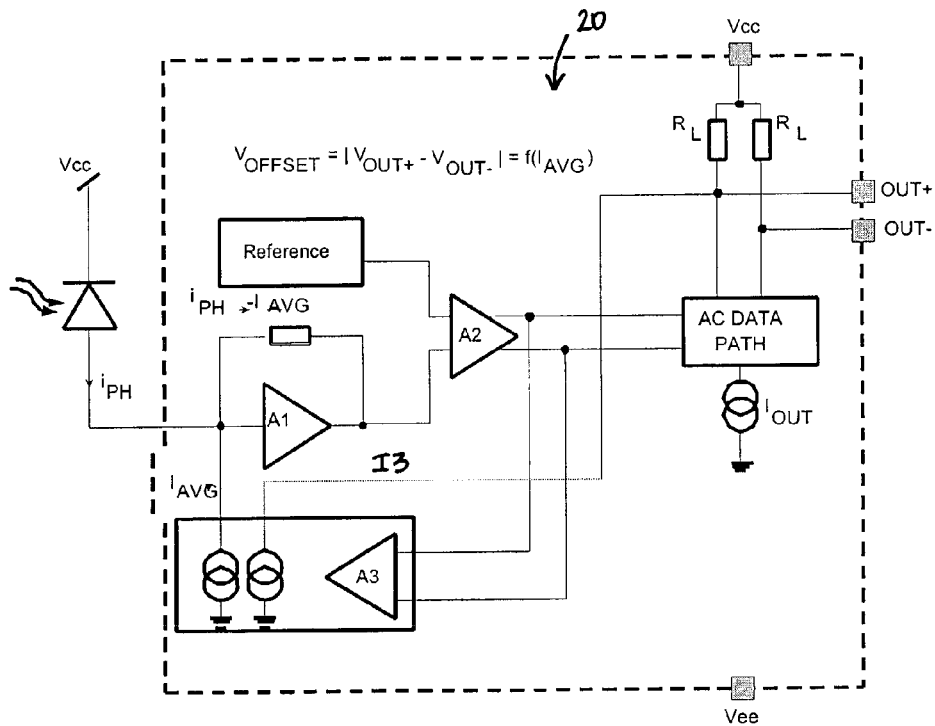
FIG. 7 is a block diagram of a photodiode and preamplifier in accordance with another embodiment of the present invention.
Figure 8:
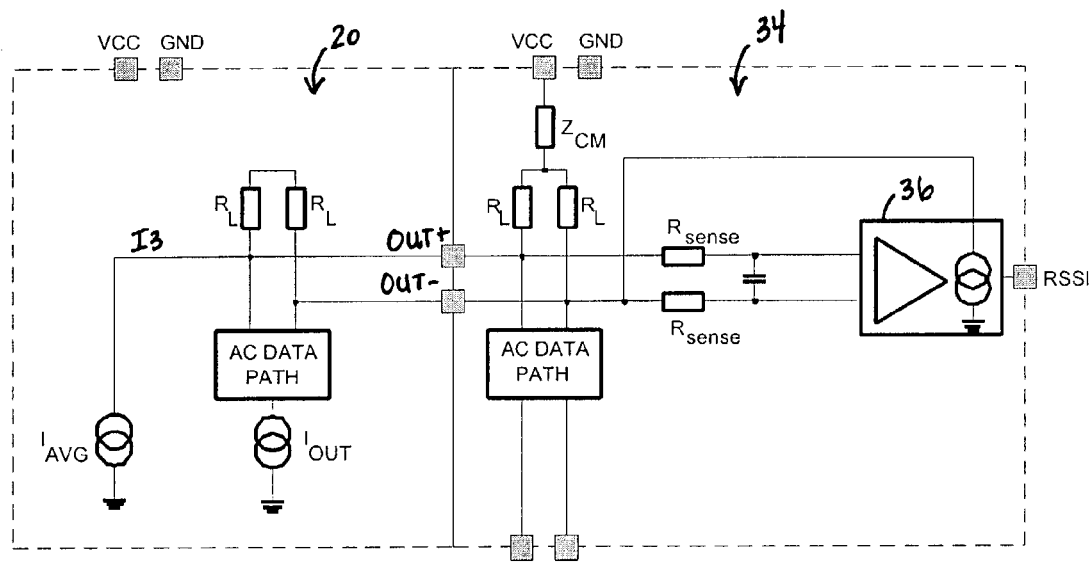
FIGS. 8 and 9 illustrate exemplary postamplifier embodiments usable with the preamplifier of FIG. 7.

Now referring to FIG. 8, a still further embodiment of the preamplifier 20 may be seen. In this embodiment, current source I3 is coupled to one of the output terminals of the preamplifier, in this specific case the positive output terminal OUT+ has been chosen. The preamplifier 20 of FIG. 7 may be used with postamplifier 34 of FIG. 8. In this embodiment, the OUT+ terminal is loaded by a current responsive to the average current component $I_{AVG}$ and the OUT− terminal is not loaded by such a current component. Consequently the average differential output of OUT+, OUT− is responsive to the average current $I_{AVG}$ to provide the received signal strength indication.

In the embodiment of FIGS. 2 and 3, the received signal strength indication is provided by the preamplifier controlling the common mode of the differential output signal. In the embodiment of FIG. 8 and considering the preamplifier alone, the common mode voltage of the output signal (VOUT+ +VOUT−)/2 is effected. However the output signal itself in the sense of (VOUT+ −VOUT−) is also effected, but of course not at the received signal frequencies. When connected to the postamplifier, the postamplifier feedback causes an unbalanced output current from the preamplifier to drive the average output signal (VOUT+ −VOUT−) to zero. While this affects the common mode output also, it is the average output signal (VOUT+ −VOUT−) that is driven to zero. Consequently, in some embodiments of the present invention, it is the preamplifier common mode output that contains the RSSI information, while in other embodiments, the RSSI information might be considered to be in other than the preamplifier common mode output. For purposes of this disclosure and the claims that follow, the RSSI information shall be considered to be provided in the quiescent output of the preamplifier, where the quiescent output means the average voltage or current output, or a combination of both, of one or both of the preamplifier differential outputs on which the received signal itself is superimposed. The quiescent output may be comprised, by way of example, of the preamplifier common mode voltage output (FIGS. 2 and 3), the preamplifier common mode current output (FIG. 6 considering the presence of the postamplifier), the preamplifier average differential voltage output or the preamplifier average voltage output on one of the differential outputs (FIG. 7, considering the preamplifier alone), or the preamplifier average differential current output or the preamplifier average current output on one of the differential outputs (FIGS. 7 and 8, considering the presence of the postamplifier).

Figure 9:
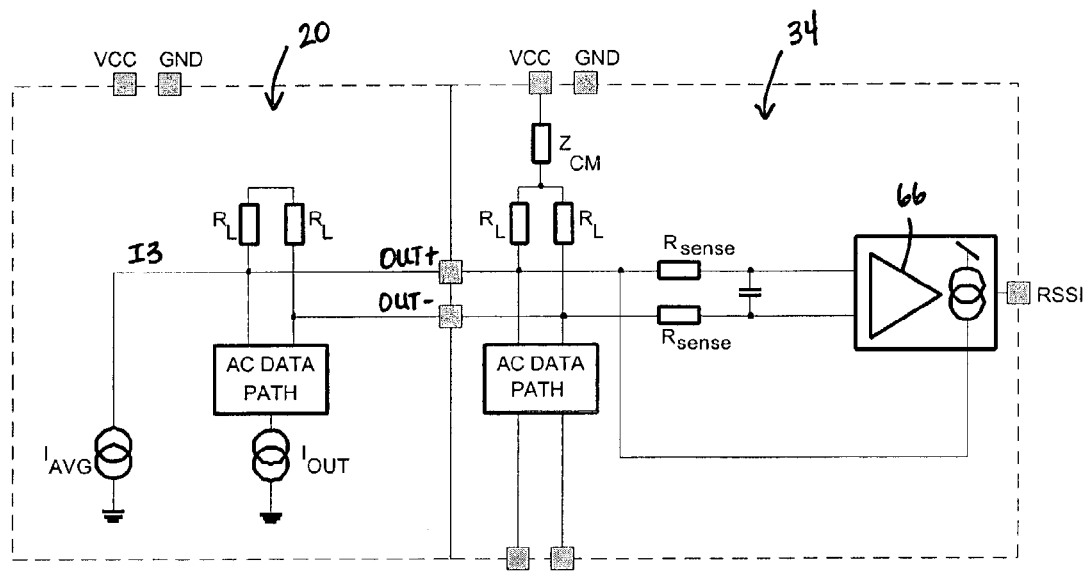

FIG. 9 illustrates an embodiment of a postamplifier 34 that may be used with preamplifier 20 of FIG. 7. In this embodiment of the postamplifier, amplifier 66 amplifies the DC voltage difference between the differential output terminals of the preamplifier, the output of amplifier 66 controlling the feedback current I3 to the preamplifier terminal OUT+. This embodiment has the advantage of not requiring a precise reference, not having a dynamic range that is limited by the supply voltage and not having operating conditions of the DC-coupled interface varying over the optical power input range.

Figure 10:
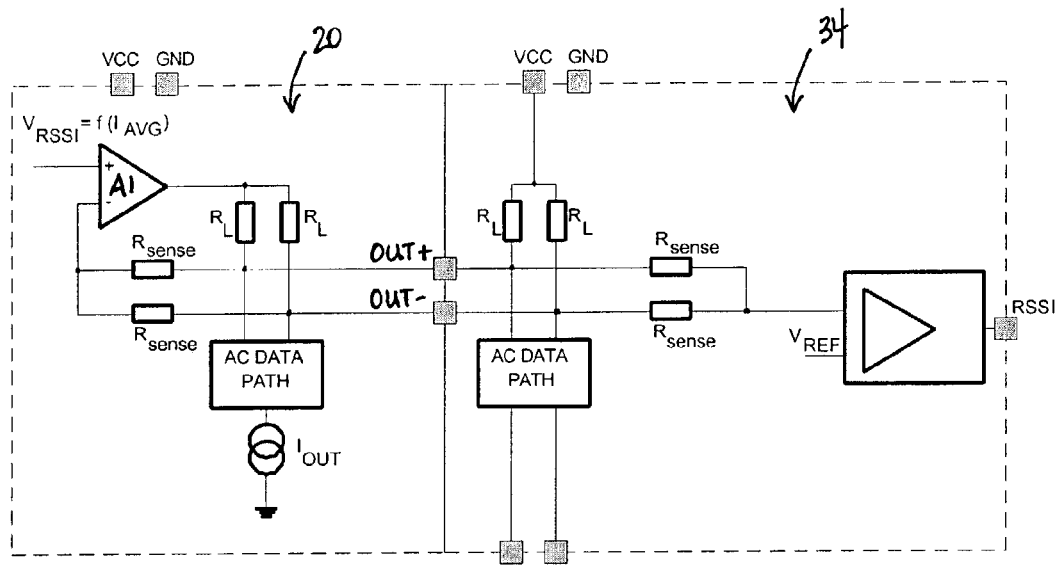
FIG. 10 is a block diagram showing relevant portions of a preamplifier and postamplifier of another embodiment of the present invention.

In the embodiment of FIG. 10, amplifier A1 configured as a feedback amplifier is responsive to an input voltage proportional to, or at least a function of, the average diode current (see FIGS. 2 and 3 for the generation of such a signal) to control the voltage applied to the load resistors $R_L$. Two sense resistors $R_{SENSE}$ in the preamplifier sense the DC level of the differential voltage coupled to the post amplifier for feedback to amplifier A1, and two sense resistors $R_{SENSE}$ in the postamplifier sense the DC level of the differential voltage coupled to the post amplifier for comparison with a reference voltage $V_{REF}$ to provide the RSSI signal responsive to that difference. The advantage of this embodiment is that it is a low power implementation, and the feedback cancels any distortion to the common mode voltage at the interface, which is not related to the $I_{AVG}$.

Figure 11:
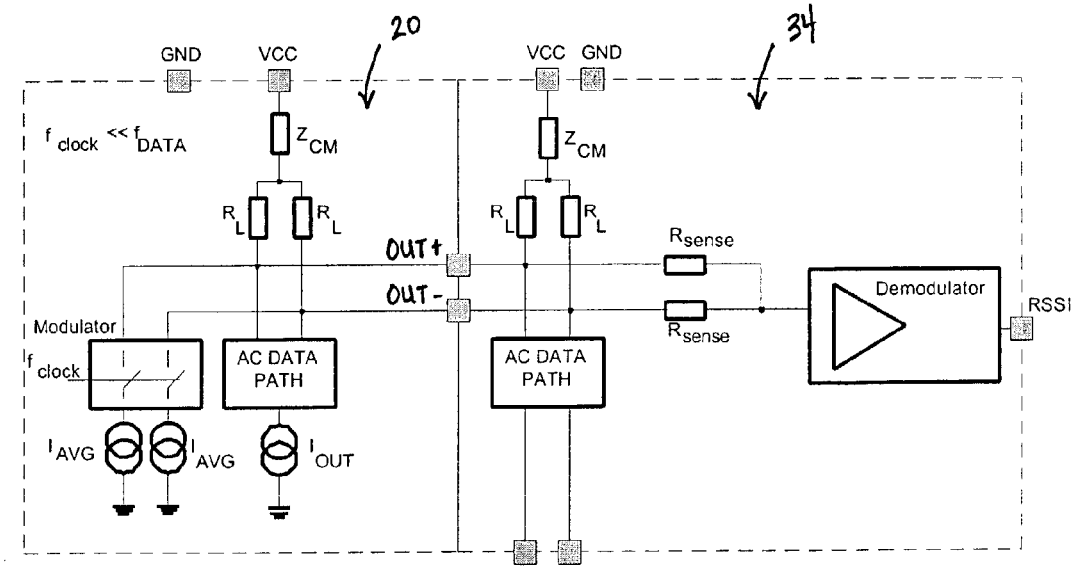
FIG. 11 is a block diagram showing relevant portions of a preamplifier and postamplifier of still another embodiment of the present invention.

In the embodiment of FIG. 11, currents proportional to, or at least a function of, the average diode current $I_{AVG}$ are coupled to the load resistors $R_L$ in the preamplifier through a modulator operating at a clock rate $f_{CLOCK}$. The clock rate preferably is a low rate compared to the data rate which does not effect the received data, though could be, for example, the data rate or a subharmonic of the data rate. In any event, the modulator modulates the quiescent component of the signal out of the preamplifier responsive to the function of the average diode current used, which results in a much more accurate measurement of the common mode voltage in the demodulator associated with the postamplifier stage because of the fact that a differential measurement can be done.

It may be seen from the foregoing disclosure that the present invention contemplates having a common mode signal on the differential output of the transimpedance amplifier of a photodiode/preamplifier module that is indicative in some manner of the received optical signal strength. In some embodiments, the common mode output voltage of the preamplifier is indicative of the average photodiode current and thus provides the received signal strength indication RSSI signal) for interpretation by the postamplifier. In the embodiment of FIG. 7, the preamplifier unsymmetrically shifts the common mode voltage of the differential output of the preamplifier, considering the preamplifier alone, but when the preamplifier is connected to the postamplifier (FIGS. 8 and 9), the closed loop in the postamplifier drives an unsymmetrical current back to the preamplifier through the differential output terminals thereof to drive the common mode voltage of the differential output of the preamplifier to zero, leaving an unsymmetrical common mode current at the preamplifier output/postamplifier input interface.

Figure 12:
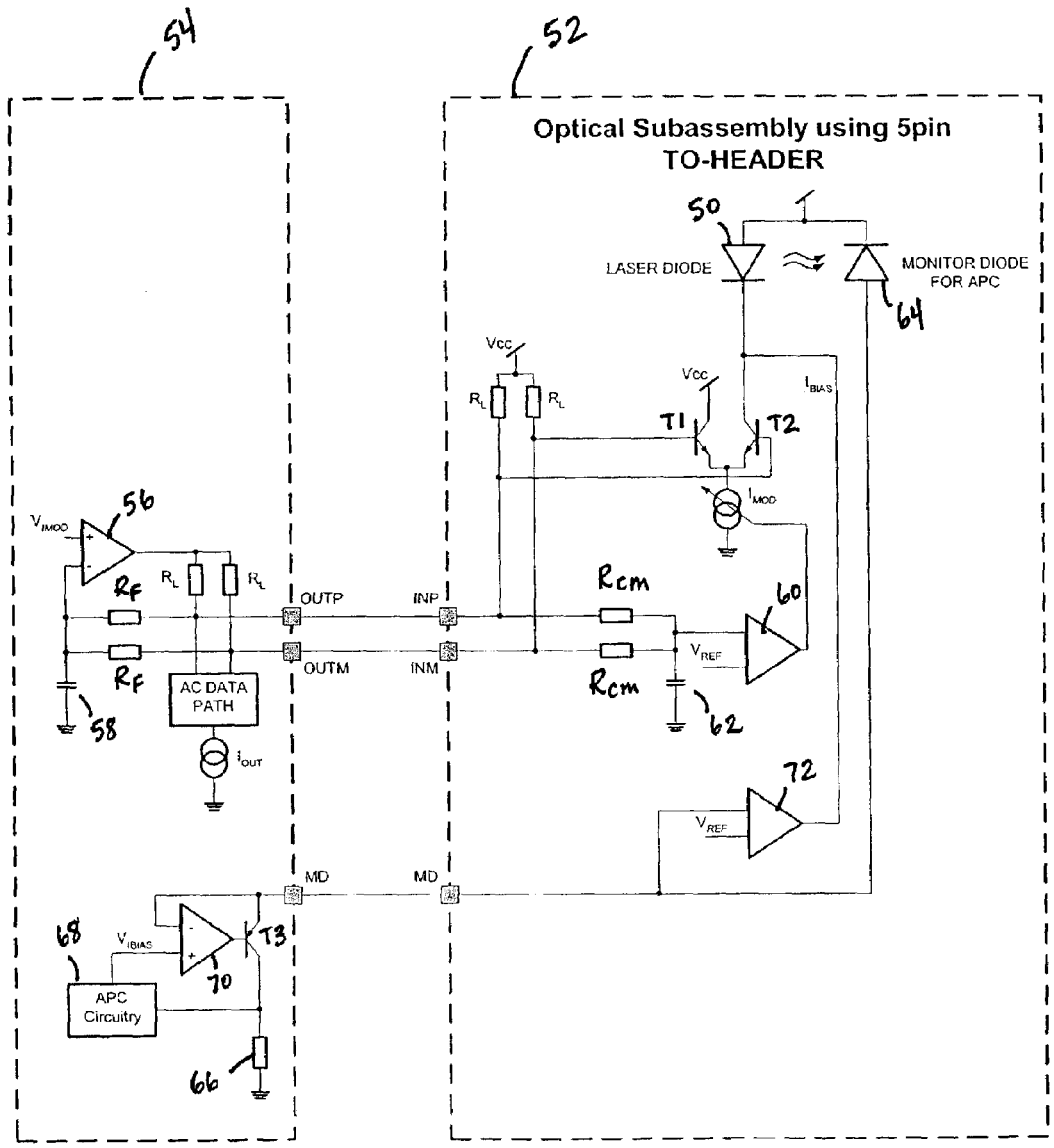
FIG. 12 is an exemplary embodiment of the present invention as applied to opto-electronic transmitters.

Now referring to FIG. 12, an exemplary embodiment of the present invention as applied to opto-electronic transmitters may be seen. In this embodiment, a laser diode 50 and associated driver electronics is packaged in a 5 pin TO-header, generally indicated by the numeral 52, with a pre-driver integrated circuit 54 interfaced therewith. The pre-driver has an AC data path shown symbolically in FIG. 13, typically comprised of a differential pair steering the current source $I_{OUT}$ to the line connected to OUTP or OUTM in accordance with the data to be optically transmitted as controlled by a single-ended or differential input to the AC data path. Load resistors $R_L$ provide the desired output impedance for the data signal with resistors $R_F$ providing common mode voltage feedback to the differential amplifier 56. Capacitor 58 provides filtering for the ripple at the signal frequencies and harmonics thereof for the data signal to be transmitted. The positive input to amplifier 56 is provided by an input to the pre-driver $V_{IMOD}$, and with the negative feedback provided by the feedback resistors $R_F$, the common mode output voltage OUTP,OUTM for the pre-driver 54 is forced to be equal to $V_{IMOD}$.

In the laser diode module, the AC data signal on the input terminals INP and INM are used to control transistors T1 and T2 so that the current $I_{MOD}$ provided by the current source forming the tail current for transistors T1 and T2 is controllably steered either through transistor T1 or transistor T2 in accordance with the state of the data signal. Thus, the laser diode 50 is turned on and off in accordance with the AC signal in the AC data path. Resistors $R_L$ in the laser diode module 52 provide impedance matching for the input to the module.

Resistors $R_{CM}$ recover the common voltage on the input terminals INP and INM, with the difference between the common mode voltage and the voltage $V_{REF}$ being amplified by amplifier 60 to control the current $I_{MOD}$ provided as tail current to transistors T1 and T2, the laser diode current being modulated by the AC data signal in the laser diode module 52. The capacitor 62 filters out the ripple in the common mode voltage at the AC data frequencies and harmonics thereof. Thus, the laser diode drive current $I_{MOD}$ is controlled through the pre-driver circuit 54 through the AC data path interface without requiring any additional electrical connections to the laser diode module 52.

Laser diode module 52 also contains a monitor photodiode 64 positioned to receive part of the light, typically a small part, emitted by laser diode 50 to provide a current through the monitor diode terminal MD on the laser diode module to the pre-driver module 54. The monitor diode acts as a current source through the monitor diode terminals MD substantially independent of the voltage on that line, provided the monitor diode remains appropriately backed biased. This monitor diode current passes through transistor T3 and resistor 66, providing a voltage to the automatic power control (APC) circuitry 68 which averages the voltage across resistor 66, which in turn is proportional to the average monitor diode current and thus proportional to the average laser diode current. The APC circuitry 68 controls the voltage $V_{IBIAS}$ routed to the positive input of amplifier 70 with the voltage on the monitor diode (MD) line being applied to the negative terminal of amplifier 70. Thus, the output of amplifier 70 seeks a level to turn on transistor T3 to control the voltage on the monitor diode line so that the negative input to amplifier 70 is equal to the voltage $V_{IBIAS}$. This controls one input to amplifier 72 which compares that voltage with an input $V_{REF}$ to amplifier 72 to provide a current output $I_{BIAS}$ through the laser diode 50.

This control loop is closed by the optical coupling between the laser diode 50 and the monitor diode 54 and the APC circuitry 68 in the pre-driver, with stability. This loop acts as an average power control loop, maintaining the average optical power constant over temperature, supply voltage and aging. It also provides a minimum current through the laser diode 50 during the periods when transistor T2 is turned off, avoiding extinction in the laser diode.

Figure 13:
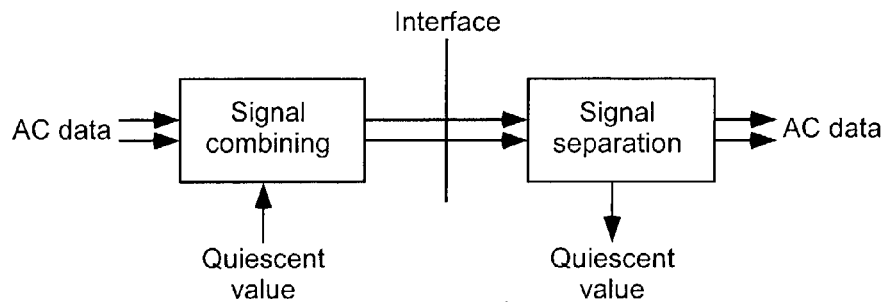
FIG. 13 is an illustration of a generalized interface between opto-electronic devices.
Figure 14:
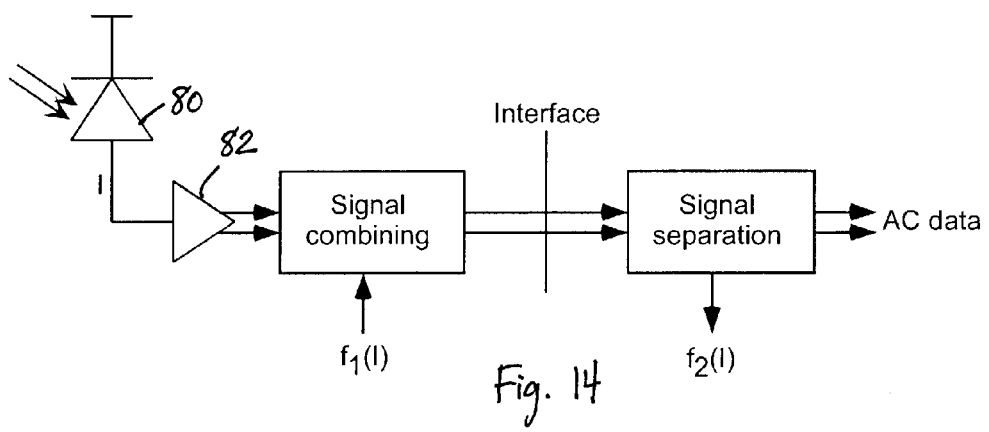
FIG. 14 is an illustration of a generalized interface between opto-electronic devices on the opto-electronic receiver side.
Figure 15:
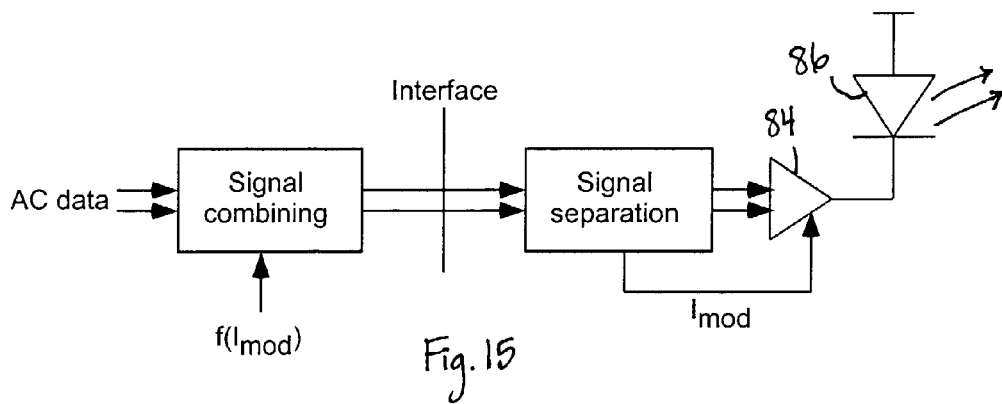
FIG. 15 is an illustration of a generalized interface between opto-electronic devices on the opto-electronic transmitter side.

Now referring to FIGS. 13, 14 and 15 generalizations for the various embodiments of the present invention may be seen. Referring first to FIG. 13, in all the various embodiments, the AC data signal is combined with a quiescent value representative of a particular parameter to provide a differential signal across an interface between modules or integrated circuits. At the other side of the interface, the quiescent value is separated from the AC data to preserve the AC data and provide a measure of the parameter represented by the quiescent value. In the case of an opto-electronic receiver comprising a preamplifier module as opposed to the amplifier module, a photodiode 80 provides a current input to output amplifier 82 providing a differential output containing the opto-electronic data signal. This is combined with a quiescent signal having a value comprising a function of the average photodiode current, providing a differential signal across the interface from which the AC data and the quiescent value or at least a function of the quiescent value may be extracted. The function $f_1(I_{AVG})$ in the exemplary embodiment disclosed herein include functions which are merely proportional to the photodiode current or a function of the square of the photodiode current, thereby providing a measure of the received optical power. The recovered function $f_2(I_{AVG})$ may be the same or different from the function $f_1(I_{AVG})$, and provides a measure of the average photodiode current or received optical power, separate and apart from the AC data signal, without requiring any additional terminals on the pre-amplifier and post-amplifier modules.

In FIG. 15, the invention is generally illustrated with respect to an opto-electronic transmitter. Here the AC data and the quiescent value of some function of the current to be modulated are combined for transmission across the interface to the laser diode module wherein the quiescent value representing the current to be modulated is separated from the AC data signal to control the current being modulated by the amplifier 84 to drive laser diode 86.

For communication across the interface of the generalized opto-electronic of FIG. 13, whether on the opto-electronic receiver side as illustrated in FIG. 14 or on the opto-electronic transmitter side as illustrated in FIG. 15, any technique for controlling the quiescent value or values at the interface, including but not necessarily limited to all of those herein before mentioned, may be used as desired.

There has been described herein certain specific embodiments of the present invention to illustrate some of the multitude of ways the invention may be implemented and practiced. The disclosed embodiments are exemplary only, as the present invention may be practiced in ways too numerous to each be individually disclosed herein. Thus, while certain preferred embodiments of the present invention have been disclosed, it will be obvious to those skilled in the art that various changes in form and detail may be made therein without departing from the spirit and scope of the invention.

What is claimed is:

1. A transimpedance amplifier for amplifying the output current of a photodiode comprising:
    an amplifier having an analog input stage having an input terminal for coupling to a photodiode, and an output stage coupled to a differential output of the analog input stage and providing a differential digital output on first and second output terminals;
    a feedback circuit coupled between the differential output of the analog input stage and the input terminal of the analog input stage to maintain an average current through the photodiode coupled thereto; and,
    a control circuit coupled to the feedback circuit, the control circuit controlling a quiescent signal on the differential digital output of the output stage responsive to the average current through the photodiode coupled to the input terminal.

2. The transimpedance amplifier of claim 1 wherein the control circuit controls a common mode quiescent signal on the differential digital output of the output stage proportional to the average current through the photodiode coupled to the input terminal.

3. The transimpedance amplifier of claim 1 wherein the control circuit controls a common mode quiescent signal on the differential digital output of the output stage as a nonlinear function of the average current through the photodiode coupled to the input terminal.

4. The transiimpedance amplifier of claim 3 wherein the nonlinear function of the average current through the photodiode coupled to the input terminal is the square root of the average current through the photodiode coupled to the input terminal.

5. The transimpedance amplifier of claim 1 wherein the feedback circuit includes an integrator integrating the difference in signals on the differential output of the input stage.

6. The transimpedance amplifier of claim 5 wherein the control circuit is coupled to an output of the integrator.

7. The transimpedance amplifier of claim 1 wherein the output stage has a predetermined output impedance.

8. The transimpedance amplifier of claim 7 wherein the control circuit controls a common mode quiescent signal on the differential digital output of the output stage by imposing equal current loads on the first and second output terminals.

9. The transimpedance amplifier of claim 7 wherein the control circuit controls the quiescent signal on the differential digital output of the output stage by imposing a current load on one of the first and second output terminals.

10. A photodiode module having first and second power supply terminals and first and second differential output terminals comprising:
    a photodiode having a first terminal coupled to the first power supply terminal;
    an amplifier having an analog input stage having an input terminal coupled to a second terminal of the photodiode, and an output stage coupled to a differential output of the analog input stage and providing a differential digital output on first and second differential output terminals;
    a feedback circuit coupled between the differential output of the analog input stage and the input terminal of the analog input stage to maintain an average current through the photodiode coupled thereto; and,
    a control circuit coupled to the feedback circuit, the control circuit controlling a quiescent signal on the differential output terminals responsive to the average current through the photodiode coupled to the input terminal.

11. The photodiode module of claim 10 wherein the control circuit controls a common mode quiescent signal on the differential output terminals proportional to the average current through the photodiode.

12. The photodiode module of claim 10 wherein the control circuit controls a common mode quiescent signal on the differential output terminals as a nonlinear function of the average current through the photodiode.

13. The photodiode module of claim 12 wherein the nonlinear function of the average current through the photodiode is the square root of the average current through the photodiode.

14. The photodiode module of claim 10 wherein the feedback circuit includes an integrator integrating the difference in signals on the differential output of the input stage.

15. The photodiode module of claim 14 wherein the control circuit is coupled to an output of the integrator.

16. The photodiode module of claim 10 wherein the output stage has a predetermined output impedance.

17. The photodiode module of claim 16 wherein the control circuit controls a common mode quiescent signal on the differential output terminals by imposing equal current loads on the differential output terminals.

18. The photodiode module of claim 16 wherein the control circuit controls the quiescent signal on the differential output terminals by imposing a current load on one of the differential output terminals.

19. A method of providing an indication of the received signal strength from a photodiode module having first and second power supply terminals and first and second differential output terminals comprising imposing a quiescent output on the differential output terminals responsive to an average current through a photodiode in the photodiode module.

20. The method of claim 19 wherein the quiescent output on the differential output terminals is made linearly responsive to an average current through the photodiode.

21. The method of claim 19 wherein the quiescent output on the differential output terminals is made nonlinearly responsive to the average current through the photodiode.

22. The method of claim 19 wherein the quiescent output is imposed on the differential output terminals by imposing the quiescent output on one of the differential output terminals relative to the other output terminal.

23. A transimpedance amplifier for amplifying an AC signal, the transimpedance amplifier having an input and a differential output and being configured to provide a quiescent component in the differential output signal responsive to an average input current through a photodiode coupled to the input of the transimpedance amplifier.

* * * * *